US010454226B2

(12) United States Patent
Lewis

(10) Patent No.: US 10,454,226 B2
(45) Date of Patent: Oct. 22, 2019

(54) POWER DISTRIBUTION UNIT FOR TRANSMITTING DATA OVER A POWER LINE

(71) Applicant: CenturyLink Intellectual Property LLC, Denver, CO (US)

(72) Inventor: Ronald A. Lewis, Monroe, LA (US)

(73) Assignee: CenturyLink Intellectual Property LLC, Broomfield, CO (US)

( * ) Notice: Subject to any disclaimer, the term of this patent is extended or adjusted under 35 U.S.C. 154(b) by 39 days.

(21) Appl. No.: 15/851,082

(22) Filed: Dec. 21, 2017

(65) Prior Publication Data

US 2018/0294610 A1  Oct. 11, 2018

Related U.S. Application Data

(60) Provisional application No. 62/482,998, filed on Apr. 7, 2017.

(51) Int. Cl.
| | |
|---|---|
| *G08C 19/12* | (2006.01) |
| *H01R 24/64* | (2011.01) |
| *H01R 27/02* | (2006.01) |
| *H05K 7/14* | (2006.01) |
| *H01R 25/00* | (2006.01) |
| *H01R 24/30* | (2011.01) |

(52) U.S. Cl.
CPC ............ *H01R 24/64* (2013.01); *H01R 24/30* (2013.01); *H01R 25/006* (2013.01); *H01R 27/02* (2013.01); *H05K 7/14* (2013.01)

(58) Field of Classification Search
CPC ........ H01R 24/64; H01R 24/22; H01R 24/30; H01R 25/003; H01R 25/006; H01R 27/02; H04Q 1/00; H05K 7/14; H05K 7/1492

USPC ....................................................... 340/13.23
See application file for complete search history.

(56) References Cited

U.S. PATENT DOCUMENTS

| | | | | |
|---|---|---|---|---|
| 5,671,355 | A * | 9/1997 | Collins ................. | G06F 13/128 709/250 |
| 5,682,383 | A * | 10/1997 | Dahod ................... | H04L 12/44 370/364 |
| 5,862,310 | A * | 1/1999 | Crawford .............. | G06F 3/1297 358/1.15 |
| 6,097,705 | A * | 8/2000 | Ben-Michael ........ | H04L 49/351 370/315 |
| 6,967,963 | B1 * | 11/2005 | Houh ..................... | H04L 47/10 370/428 |
| 9,461,867 | B1 * | 10/2016 | Atia ....................... | H04L 45/24 |
| 2002/0008628 | A1 * | 1/2002 | Sadjadi ................. | G08B 5/36 340/638 |

(Continued)

*Primary Examiner* — Kerri L McNally
*Assistant Examiner* — Thang D Tran

(57) ABSTRACT

Novel tools and techniques are provided for implementing a power distribution unit, and, more particularly, for implementing a power distribution unit to transmit data over a powerline. In various embodiments, a power distribution unit, might electrically and communicatively couple one or more external devices to a power source. The power distribution unit might include at least one power input, a plurality of power outputs, a plurality of communications ports, and at least one adapter. The at least one adapter might be configured to transmit data received from at least one communications port to the at least one power input and transmit data received from the at least one power input to at least one Ethernet port.

17 Claims, 6 Drawing Sheets

(56) References Cited

U.S. PATENT DOCUMENTS

| | | | | |
|---|---|---|---|---|
| 2003/0121689 A1* | 7/2003 | Rasmussen | G06F 1/189 | 174/50 |
| 2006/0044302 A1* | 3/2006 | Chen | H01R 13/6675 | 345/211 |
| 2006/0282687 A1* | 12/2006 | Bahali | G06F 1/3203 | 713/300 |
| 2007/0007823 A1* | 1/2007 | Huang | G06F 1/26 | 307/52 |
| 2007/0161293 A1* | 7/2007 | Ewing | H01R 13/68 | 439/620.26 |
| 2007/0174528 A1* | 7/2007 | Mantver | G06F 1/266 | 710/100 |
| 2008/0150480 A1* | 6/2008 | Navid | H01R 31/06 | 320/113 |
| 2008/0244281 A1* | 10/2008 | Felten | G06F 1/28 | 713/300 |
| 2009/0027847 A1* | 1/2009 | Li | H01R 13/514 | 361/679.41 |
| 2010/0041277 A1* | 2/2010 | Huber | H01R 25/142 | 439/638 |
| 2011/0006603 A1* | 1/2011 | Robinson | G06F 1/263 | 307/31 |
| 2014/0119380 A1* | 5/2014 | Bakhshi | H04L 69/18 | 370/409 |
| 2014/0213101 A1* | 7/2014 | Gomez | H01R 27/02 | 439/505 |
| 2014/0258738 A1* | 9/2014 | Greenwalt | G06F 1/3206 | 713/300 |
| 2014/0355610 A1* | 12/2014 | Ge | H04B 3/542 | 370/392 |
| 2015/0076976 A1* | 3/2015 | Bailey | H05K 5/023 | 312/223.6 |
| 2015/0084419 A1* | 3/2015 | Wishman | G06F 1/26 | 307/23 |
| 2015/0253821 A1* | 9/2015 | Palmer | G06F 1/189 | 361/679.31 |
| 2015/0256355 A1* | 9/2015 | Pera | H04L 12/2803 | 700/90 |
| 2016/0105021 A1* | 4/2016 | Murray | G02B 6/3817 | 385/75 |
| 2016/0186973 A1* | 6/2016 | Chien | F21S 8/035 | 362/253 |
| 2016/0253283 A1* | 9/2016 | Bowers | G06F 13/4068 | 710/305 |
| 2016/0329732 A1* | 11/2016 | Koyama | H01M 10/4257 | |
| 2016/0352101 A1* | 12/2016 | Koo | H02J 1/12 | |
| 2017/0034597 A1* | 2/2017 | Shih | H04Q 1/136 | |
| 2017/0111451 A1* | 4/2017 | Thul | H04L 67/125 | |
| 2017/0246741 A1* | 8/2017 | Kobayashi | B25J 9/126 | |
| 2017/0318445 A1* | 11/2017 | Kodaypak | H04M 3/5116 | |
| 2019/0229478 A1* | 7/2019 | Iaconis | H01H 83/02 | |

* cited by examiner

POWER DISTRIBUTION UNIT FOR TRANSMITTING DATA OVER A POWER LINE

CROSS-REFERENCES TO RELATED APPLICATIONS

This application claims priority to U.S. Patent Application Ser. No. 62/482,998 (the "'998 Application"), filed on Apr. 7, 2017 by Ronald A. Lewis, entitled, "G.hn Power Distribution Unit for Server Racks," the disclosure of which is incorporated herein by reference in its entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to power line communications, and, more particularly, to a power distribution unit for power line communications.

BACKGROUND

In a conventional arrangement, server racks typically include power distribution units (PDUs) to receive electrical power from a power input and distribute the electrical power to a plurality of electronic devices. The PDU may include one or more sockets (also referred to as outlets) to which the plurality of electronic devices of a server rack may be coupled to receive power. Then, each server of the server rack is separately connected, via Ethernet cables or fiber optic cables, to a hub, switch, router, or other network device. Thus, cable length and other cable management issues become problematic in environments where server racks are often moved, or connections swapped, such as in a lab, data center, or server farm.

Hence, more robust solutions for a power distribution unit for transmitting data over a powerline are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

Overview

Figure 1:
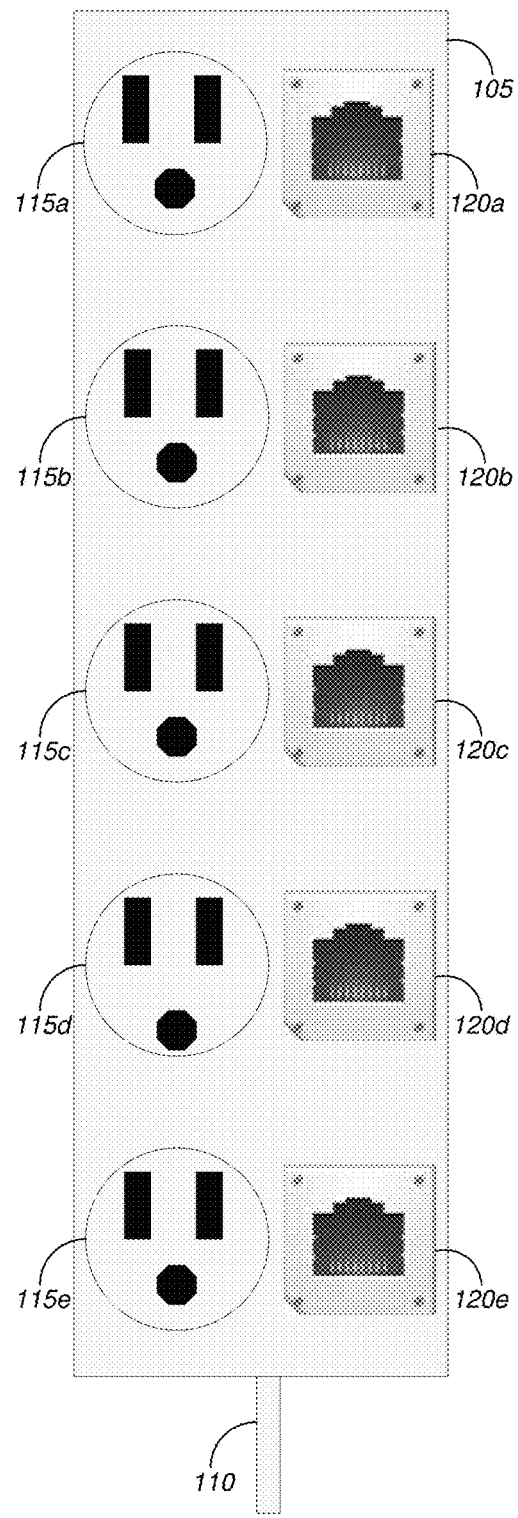
FIG. 1 is a schematic diagram illustrating a power distribution unit for transmitting data over powerline, in accordance with various embodiments.

Various embodiments provide tools and techniques for implementing a power distribution unit, and, more particularly, for implementing a power distribution unit for transmitting data over a powerline.

The following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

In an aspect, an apparatus might include a power distribution unit. The power distribution unit might include at least one power input configured to receive power from at least one external power source and a plurality of power outputs. Each power output may be configured to receive power from the at least one external power source and deliver power to an external device coupled to each power output. The power distribution unit might further include a plurality of communications ports, each communications port may be configured to deliver data to and receive data from the external device coupled to each power output. One communications port might correspond to each power output of the plurality of power outputs. The power distribution unit might additionally include at least one adapter. Each adapter might be configured to transmit data received from at least one communications port from among the plurality of communications ports to the at least one power input and transmit data received from the at least one power input to at least one communications port from among the plurality of communications ports. The adapter might be at least one of a G.hn adapter or a HomePlug adapter.

In some embodiments, the power distribution unit might be coupled to a server rack. The one or more external devices coupled to each power outlet and/or each communications port might be one or more servers on the server rack. The one or more servers on the server rack may be communicatively coupled to a corresponding communications port via a wired and/or wireless connection and each communications port may be a different collision domain.

According to some embodiments, one adapter may correspond to each Ethernet port. In other embodiments, one adapter may correspond to at least two communications ports. Each adapter may be configured to determine a particular communications port from among the plurality of communications ports to receive a data stream received from the at least one power input.

In some cases, the power distribution unit might further comprise at least two power inputs. Each power input may be on a different circuit and each circuit may be a different network. The adapter may be configured to switch between the at least two power inputs. Further, the one adapter may be configured to determine a particular power input from among the at least two power inputs to receive a data stream from the at least one Ethernet port.

In another aspect, a system might comprise a data center or a server farm. The data center and/or server farm may comprise one or more server racks, one or more computing devices coupled to each of the one or more server racks, and/or one or more power distribution units coupled to the one or more server racks. At least one power distribution unit might include at least one power input configured to receive power from at least one external power source and a plurality of power outputs. Each power output may be configured to receive power from the at least one external power source and configured to deliver power to a computing device (also referred to as external device) of the one or more computing devices coupled to each power output. The power distribution unit may further include a plurality of communications ports. Each communications port may be configured to deliver data to and receive data from the computing device coupled to each power output. One communications port may correspond to each power output of the plurality of power outputs. The power distribution unit may also include at least one adapter. Each adapter might be configured to transmit data received from at least one communications port from among the plurality of communications ports to the at least one power input and transmit data received from the at least one power input to at least one communications port from among the plurality of communications ports.

In some embodiments, the data center may have one or more power circuits. Each power circuit may be coupled to at least one power distribution unit. Each power circuit may further be a different network. Each server rack of the data center may be moved by disengaging the external power source without disengaging the one or more computing devices from the one or more corresponding communications ports.

Each communications port on the power distribution unit may be a different collision domain. In some cases, one adapter might correspond to each Ethernet port. In other embodiments, one adapter might correspond to at least two communications ports. The adapter may be configured to determine a particular communications port from among the plurality of communications ports to receive a data stream received from the at least one power input. Additionally and/or alternatively, at least one of the one or more computing devices might be configured to receive a data stream based on a determination, by the at least one computing device, that the data stream received from the power input is addressed to the at least one computing device.

Another aspect might be a method for distributing data over powerline using a power distribution unit. The method might include mounting a power distribution unit to a server rack, coupling the power distribution unit to an external power source, and mounting one or more external devices to the server rack. The method might additionally include coupling the one or more external devices to one or more corresponding power outlets on the power distribution unit and providing power, with the power distribution unit, to the one or more external devices coupled to the one or more corresponding power outlets on the power distribution unit. The method might further include coupling the one or more external devices to one or more corresponding communications ports on the power distribution unit and providing a data over powerline connection, with the power distribution unit, between the external device and a powerline. The method might also include transmitting, with the power distribution device, at least one of data to the external device from the powerline or data to the powerline from the external device.

Various modifications and additions can be made to the embodiments discussed without departing from the scope of the invention. For example, while the embodiments described above refer to particular features, the scope of this invention also includes embodiments having different combination of features and embodiments that do not include all of the above described features.

Specific Exemplary Embodiments

The methods, systems, and apparatuses illustrated by FIGS. 1-6 refer to examples of different embodiments that include various components and steps, which can be considered alternatives or which can be used in conjunction with one another in the various embodiments. The description of the illustrated methods, systems, and apparatuses shown in FIGS. 1-6 is provided for purposes of illustration and should not be considered to limit the scope of the different embodiments.

FIG. 1 is a schematic diagram illustrating a power distribution unit ("PDU") 100 for transmitting data over a powerline, in accordance with various embodiments.

The PDU 100 may include a housing 105, power input(s) 110, power output(s) 115a-115e (collectively, power outputs 115), and communications port(s) 120a-120e (collectively, communications port(s) 120). The PDU 100 may be configured to provide power from power input(s) 110 to power output(s) 115. Additionally, or alternatively, PDU 100 may be configured to provide a Power-Line Communications ("PLC") link and transmit data from communications port(s) 120 to power input(s) 110 and/or transmit data from power input(s) 110 to communications port(s) 120. The PDU 100 may further be communicatively coupled (via a wired and/or wireless connection) to a network such as a service provider network and/or a local area network.

In various embodiments, the PDU 100 might include housing 105. Power input(s) 110, power output(s) 115, and communications port(s) 120 may be located on housing 105. Power input(s) 110, power output(s) 115, and communications port(s) 120 may be located on a same side of housing 105. In an alternative arrangement, power input(s) 110, power output(s) 115, and communications port(s) 120 may be located on different sides of housing 105.

In further embodiments, the PDU 100 might include one or more power input(s) 110. The power input(s) 110 may be electrically coupled to an external power source (e.g., an alternating current ("A/C") power source or a direct current ("D/C") power source). In various embodiments, the external power source may, for example, include without limitation on-premises electrical circuits (e.g., residential or commercial wiring, in-lab setups) coupled to a power grid, a battery, an electrical generator, or other power supply. The power input(s) 110 may further be configured to provide a PLC link to simultaneously carry both data and electric power to PDU 100.

In some embodiments, the PDU 100 might include at least two power inputs 110. In some embodiments, each of the at least two power input(s) 110 may be coupled to a circuit (e.g., different power circuits, multiple on-premises electrical circuits and wiring). In some embodiments, the at least two power input(s) 110 may be coupled to the same circuit, while in other embodiments, each of the at least two power input(s) 110 may be coupled to a respective circuit. Thus, each circuit may, in turn, be associated with a network. In some embodiments, each of the circuits may be associated with the same network (e.g., a service provider network, local area network, etc.). Alternatively, each circuit may be associated with a different network and/or domain (e.g., different local area networks, different service provider networks, a service provider network and a local area network, etc.). For example, each circuit may include its own local network, separate from the other circuits. Thus, the PDU 100 may be configured to transmit data over different networks, based on which of the at least two power input(s) 110 is used to transmit data. In some embodiments, the PDU 100 may further include a switch (not shown) to determine which of the at least two power input(s) 110 should be utilized. The switch may be a physical switch on the housing 105, or implemented in software. In yet further embodiments, the PDU 100 may include logic, programmed to determine which of the at least two power input(s) should be utilized. In some embodiments, a single power input, a subset of power inputs, or all of the at least two power input(s) 110 may be connected to a respective circuit.

In further embodiments, the PDU 100 might be configured to supply power to the one or more power output(s) 115. For example, in some embodiments, the one or more power output(s) 115 may be electrically coupled to the one or more power input(s) 110. Thus, the one or more power output(s) 115 may be configured to deliver power to devices coupled via the socket. Accordingly, the one or more power output(s) 115 may be configured to allow one or more external devices (also referred to as computing devices) to couple to the one or more power output(s) 115 via a socket. The socket may be configured to receive a plug or other connector of the one or more external devices. The one or more external devices may include, without limitation, a blade server or server system, a rack server or server system, other types of server computers, cooling systems, storage devices and drives, and/or network devices.

In various embodiments, the PDU 100 might further be configured to communicatively couple (via a wired and/or wireless connection) the one or more power input(s) 110 to one or more communications port(s) 120. For example, PLC standards, specifications, and protocols, known to those skilled in the art, may define how a data signal, received via power input(s) 110, may be received, and in which data may be transmitted, via the power input(s) 110, over a circuit for power delivery (e.g., premises wiring). Suitable standards, specifications, and protocols may include, without limitation, HomePNA. G.Hn, IEEE 1901, broadband over power lines (BPL), and HomePlug. In various embodiments, the PDU 100 may further include one or more adapters for extracting data signals from the power line/power signal from the power input(s) 110, and for injecting data signals into the power line of the power input(s) 110, according to one or more of the PLC standards, specification, and protocols described above. The one or more communication port(s) 120 may be communicatively coupled (via a wired and/or wireless connection) to one or more external devices. Communication port(s) 120 may include, for example, Ethernet ports, telephone jacks, FireWire, universal serial bus (USB) ports, Thunderbolt, serial ports, optical ports, and other types of ports for electronic communication. Data might be transmitted from the one or more power input(s) 110 to the one or more external devices via the communications port(s) 120. Additionally, or alternatively, data might be transmitted to the one or more power input(s) 110 from the one or more external devices via the communications port(s) 120. For example, data transmitted by an external device, through a respective communications port 120, may be transmitted to a respective circuit (e.g., premises wiring) via the one or more power input(s) 110. Accordingly, the PDU 100 may be configured to both receive and transmit signals via the one or more power input(s) 110.

In some embodiments, because the PDU 100 may include a plurality of communications ports over a shared transmission line of the one or more power input(s) 110, the PDU 100 may be configured to support multiple-in multiple-out (MIMO) communications. Accordingly, the PDU 100 may be configured to utilize various collision avoidance techniques (e.g., manage channel access), including without limitation time-division multiple access (TDMA), further including contention free transmission opportunities (CFTXOP) and shared transmission opportunities (STXOP), orthogonal frequency-division multiple access (OFDMA), and carrier sense multiple access (CSMA). In some further embodiments, each of the communications port 120 may be configured to operate on its own, respective collision domain. For example, the PDU 100 may include a switch configured to create a separate collision domain for each communications port 120. Each collision domain enables an external device connected to a communications port 120 to transmit data at any time without data transmissions from multiple communications ports interfering.

In some embodiments, the PDU 100 may include at least one power output 115 for each communications port 120. Thus, in some embodiments, each external device may be coupled to at least one power output 115 to receive power and one communications port 120 to receive and/or transmit data. In other embodiments, the PDU 100 might have more power outputs(s) 115 than communications port(s) 120. In this scenario, external devices (e.g., one or more cooling systems) that do not need to be coupled to a communications port 120 may only receive power from PDU 100. In additional embodiments, the PDU 100 might have more communications port(s) 120 than power output(s) 115. In this case, one or more external devices may be coupled to two or more communications port(s) 120. Each communications port 120 may be communicatively coupled to a different network (e.g., different local area networks, different service provider networks, a local area network and a service provider network, etc.). The external device may then select a particular network to transmit data and transmit the data via the communications port 120 corresponding to the selected network.

In some embodiments, the various components of the PDU 100 of FIG. 1 may be incorporated within a single housing 105 or body that includes the entirety of the PDU 100, power input(s) 110, power output(s) 115, and communications port(s) 120; alternatively, the PDU 100 might include a plurality of components divided between two or more discrete housings. Additionally, the various components of the PDU 100 may be located on a same side of the housing 105 and/or different sides of the housing 105.

Figure 2:
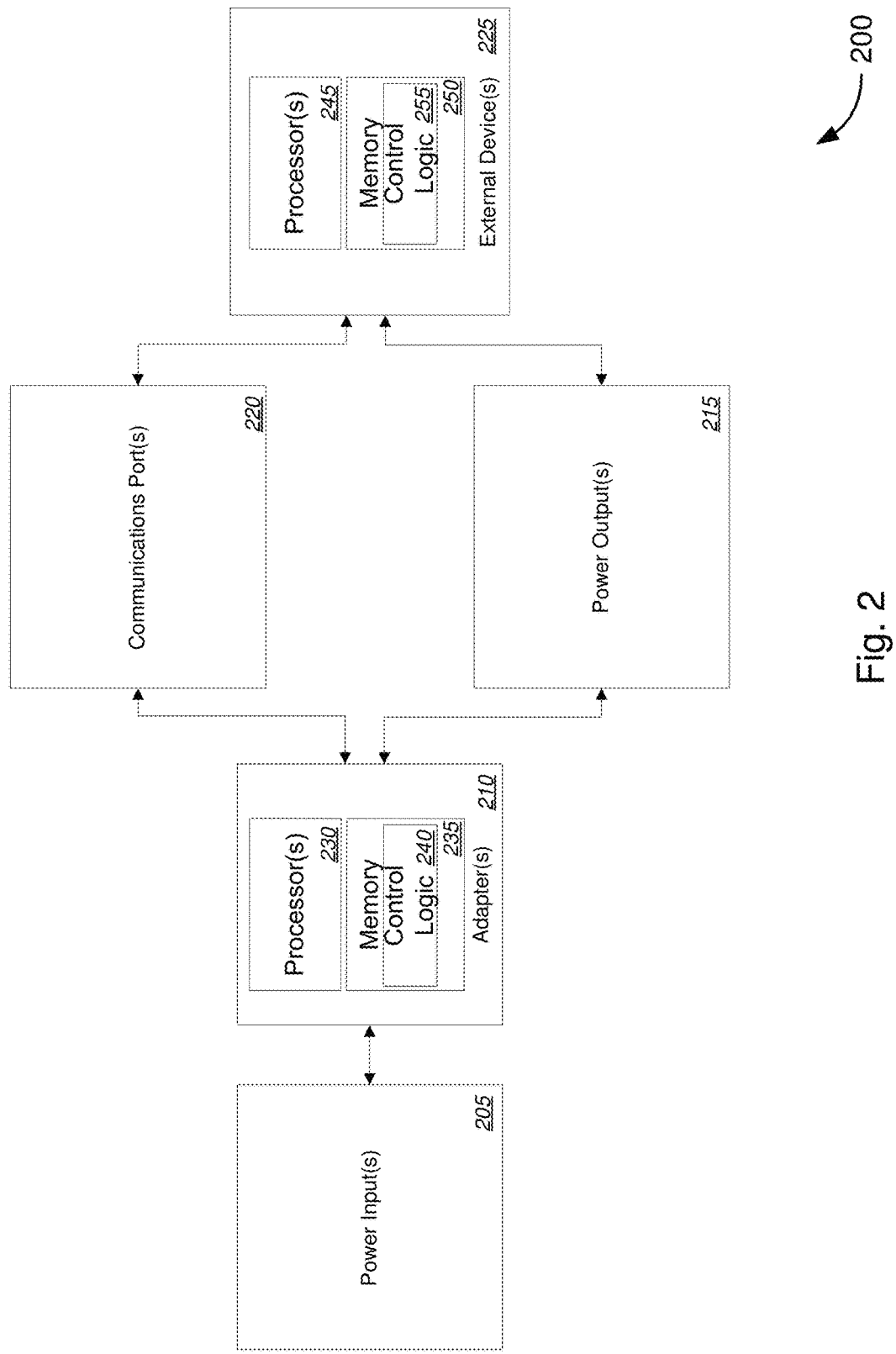
FIG. 2 is a functional block diagram illustrating a power distribution unit for transmitting data over powerline, in accordance with various embodiments.

FIG. 2 is a functional block diagram illustrating a power distribution unit ("PDU") 200 for transmitting data over a powerline, in accordance with various embodiments. The PDU 200 (which, in some embodiments, may correspond to PDU 100 of FIG. 1) may include power inputs 205, adapter(s) 210, power output(s) 215, communications port(s) 220, and external device(s) 225. The PDU 200 may be configured to provide power from power input(s) 205 to power output(s) 215. Additionally and/or alternatively, PDU 200 may be configured to provide a PLC link and may be configured to transmit data from communications port(s) 220 to power input(s) 205 and/or transmit data from power input(s) 205 to communications ports 220.

As previously described with respect to FIG. 1, in various embodiments, the PDU 200 might include one or more power input(s) 205. The power input(s) 205 may be electrically coupled to an external power source, such as on-premises electrical circuits coupled to a power grid, such as premises (residential and commercial) wiring and in-lab setups, a battery, an electrical generator, or other power supply. The power input(s) 205 may further be configured to provide a PLC link to simultaneously carry both data and electric power to PDU 200.

In some embodiments, the PDU 200 might include at least two power inputs 205. As previously described, each power input 205 might be on a different circuit, or in some examples, on the same circuit. Each circuit may, in turn, be coupled to a respective network. In some embodiments, multiple circuits may be associated with the same network, or alternatively, each circuit may be associated with its own respective network. Thus, data transmitted over the at least two power input(s) 205 may be transmitted on one or more networks.

In further embodiments, the PDU 200 may include one or more adapter(s) 210. The one or more adapter(s) 210 may be coupled to the one or more power input(s) 205, one or more power output(s) 215, and one or more communications port(s) 220. In various embodiments, the adapter(s) 210 may be configured to extract data, received from the one or more power input(s) 205, and provide the data to an appropriate communication port 220. The adapter(s) 210 may further be configured to receive data, received from one or more externa devices via the one or more communications port(s) 220, and transmit the data via the one or more power input(s) 205 for transmission over a respective circuit (e.g., premises wiring). Moreover, the adapter(s) 210 may be configured to provide power, received over power input(s) 205, to the one or more power output(s) 215. Accordingly, the adapter(s) 210 may be configured to receive and extract data received over the power input(s) 205, and transmit data over the power input(s) 205. In some examples, the one or more adapter(s) 210 may further comprise one or more power adapter(s) that convert an A/C power source received from power input(s) 205 to a D/C power source. Alternatively, the one or more adapters 210 may include one or more power adapter(s) that convert a D/C power source received from power input(s) 205 to an A/C power source. Additionally and/or alternatively, the adapter(s) 210 may be coupled to communications port(s) 220. In some examples, the one or more adapter(s) 210 may be configured to include communications adapters that provide a PLC link to the power input(s) 205 and/or external device(s) 220 via the communications port(s) 220. The PLC link may be at least one of an A/C power connection or a D/C power connection. As previously described, PLC standards, specifications, and protocols, known to those skilled in the art, may define how a data signal, received via power input(s) 205, may be received, and in which data may be transmitted, via the power input(s) 205, over a circuit for power delivery (e.g., premises wiring). Suitable standards, specifications, and protocols may include, without limitation, HomePNA, G.Hn, IEEE 1901, broadband over power lines (BPL), and HomePlug.

In some embodiments, the one or more adapter(s) 210 may be configured to couple the one or more power input(s) 205 to the one or more power output(s) 215. The one or more power output(s) 215 may be coupled to one or more external devices 225 and provide electrical power received from the one or more power input(s) 205 to the one or more external device(s) 225 via the one or more adapter(s) 210.

In further embodiments, the one or more adapter(s) 210 may couple the one or more power input(s) 205 to the one or more communications port(s) 220. The one or more communications port(s) 220 may be coupled to the one or more external devices 225 and provide data to the external devices 225 from the power input(s) 205 via the one or more adapter(s) 210. Additionally and/or alternatively, the communications port(s)may provide data to the power input(s) 205 from the external devices 225 via the one or more adapter(s) 210.

In some embodiments, a single adapter 210 may correspond to each power input 205. For example, if the PDU 200 includes at least two power inputs 205, and each power input 205 may be coupled to a different circuit associated with a different network, then each adapter 210 might transmit data to a different network associated with a corresponding power input 205. Additionally and/or alternatively, one adapter 210 may correspond to each power output 215 and/or each communications port 220. For example, each power output 215 and/or each communications port 220 may have a corresponding adapter 210 which is coupled to power inputs) 205.

In various other embodiments, the PDU 200 might include one adapter 210 corresponding to at least two power input(s) 205 and/or at least two communications ports 220. The adapter 210 may further include a processor 230, a memory 235, and control logic 240. Control logic 240 might be encoded and/or stored on a non-transitory computer readable storage medium, such as system memory 235. Control logic 240 may include various non-transitory computer readable media executable by, for example, a processor 230 of the adapter 210. The control logic 240 may include a plurality of computer readable instructions configured to be executable by the processor 230 to perform various functions. For example, the control logic 240 may include instructions, that when executed by the processor 230, cause the adapter 210 to transmit data to a particular power input 205 associated with a particular network and/or transmit data to a particular communications port 220 associated with a particular external device 225. In further embodiments, the processor 230 of the adapter 210 may determine a particular power input 205 and/or a particular external device 225 to receive data packets. In some embodiments, information about which power input 210 and/or external device should receive a data stream might be embedded in headers of packets of a data stream. When the data stream is received by an adapter(s) 210, the information might direct the adapter 210 to transport the data stream to a particular power input 205 and/or external device 225. Accordingly, in various embodiments, the control logic 240 may include instructions executable by the processor(s) 230 to support simultaneous communications over the same communication medium. As previously described, this may include support for MIMO communications, as well as the implementation of various collision avoidance techniques (e.g., manage channel access) through the adapter 210, including without limitation TDMA (e.g., CFTXOP, STXOP) OFDMA, and CSMA, Additionally and/or alternatively, in some embodiments, each external device 225 may determine whether it should receive a particular data stream from adapter 210. Each external device 225 may include a processor(s) 245, a memory 250, and control logic 255. Control logic 255 might be encoded and/or stored on a non-transitory computer readable storage medium, such as system memory 250. Control logic 255 may include various non-transitory computer readable media executable by, for example, a processor 245 of the external device 225. The control logic 255 may include a plurality of computer readable instructions configured to be executable by the processor 245 to perform various functions. For example, the control logic 255 may include instructions, that when executed by the processor 245, cause the external device 220 to determine whether to receive a particular data stream from the adapter 210.

In some embodiments, information about which external 220 device should receive a data stream might be embedded in headers of packets of a data stream. When the data stream is received by an adapter(s) 210, the adapter 210 may be configured to direct the data stream to the appropriate communications port(s) 220 and/or external device 220, based on the information. Alternatively, the external device 220 may be configured to receive the data stream from the adapter 210, based on the information.

These and other functions of the PDU 200 (and its components) are described in greater detail below with respect to FIGS. 3-6.

Figure 3:
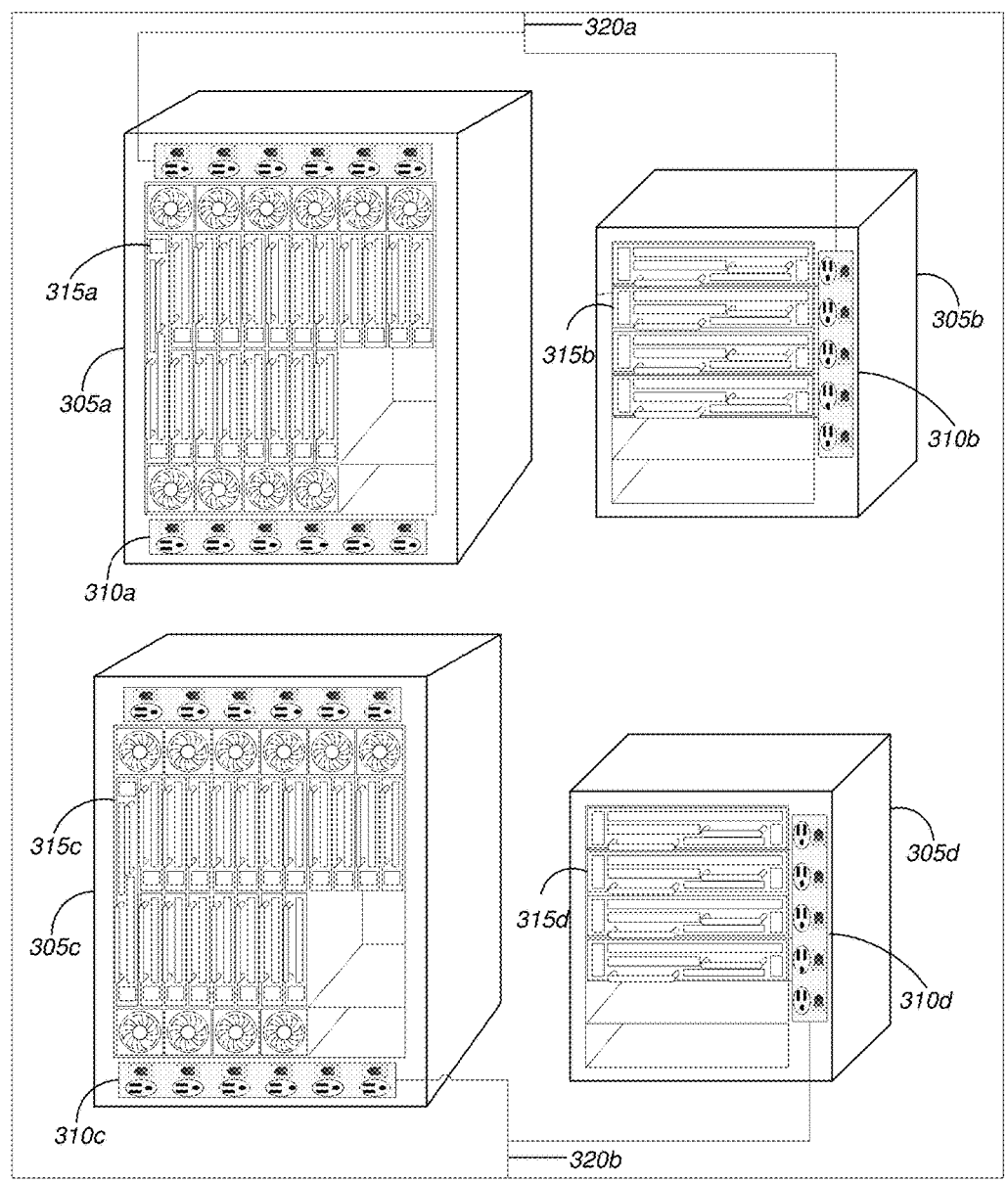
FIG. 3 is a schematic diagram illustrating a system for transmitting data over powerline, in accordance with various embodiments.

FIG. 3 is a schematic diagram illustrating a system 100 for transmitting data over a powerline, in accordance with various embodiments. The system 300 may include one or more server storage system(s) 305a-305d (collectively, server storage system(s) 305), one or more PDU(s) 310a-310d (collectively, PDU(s) 310), one or more external device(s) 315a-315d (collectively, external device(s) 315), and one or more circuit(s) 320a and 320b (collectively, circuit(s) 320).

In various embodiments, the system 300 may include at least part of a data center or server farm. The data center or server farm may include a plurality of power lines on one or more circuit(s) 320. Each circuit 320 may be configured to provide both power and data to devices electrically and communicatively coupled to circuit(s) 320. Each circuit 320 may be associated with a network (e.g., local area network, service provider network, etc.). In some cases, circuit(s) 320 may be associated with a same network (e.g., same local area network, same service provider network, etc.). In other cases, circuit(s) 320 may be associated with different networks (e.g., different local area networks, different service provider networks, a local area network and a service provider network, etc.). For example, circuit 320a may be associated with a first local area network and circuit 320b may be associated with a second local area network. The first and second local area networks may be different networks. If the first and second local area networks are different, data transmitted over circuit 320a may be transmitted on a different network than data transmitted on circuit 320b. Thus, reducing data traffic carried by each network.

The system 300 may include a plurality of server storage systems 305. In various embodiments, the server storage system(s) 305 may include, without limitation, server racks, blade server systems, and rack server systems. Each server storage system may comprise one or more wheels to move the server storage system around the data center or server farm.

One or more PDU(s) 310 may be coupled to the one or more server storage system(s) 305. The PDU(s) 310 (which may correspond to PDU 100 of FIG. 1 and/or PDU 200 of FIG. 2) may be configured to provide both a powerline connection and a data line connection (e.g., a PLC link) between one or more external devices 315 coupled to the server storage system 305 and one or more circuits 320 of the system 300. The PDU(s) may receive at least one of power or data from circuit(s) 320 and transmit data to circuit(s) 320.

One or more external devices 315 may be electrically coupled (via a wired and/or wireless connection) to the PDU 310 and receive power from PDU 310. Additionally and/or alternatively, the one or more external devices 315 may be communicatively coupled (via a wired and/or wireless connection) to the one or more PDU(s) 310 and receive data from PDU 310 and transmit data to PDU 310. The one or more external devices 315 may include, without limitation, one or more blade servers, one or more rack servers, one or more server computers (or stand-alone servers), one or more cooling systems, one or more data storage devices, one or more data storage drives, and/or one or more network devices.

By having the one or more external devices 315 electrically and communicatively coupled to the one or more PDU(s) 310, each server storage system 305 may easily be moved around system 300, or coupled to different networks. For example, to move a server storage system 305, the PDU 310 may be decoupled from a circuit 320 without decoupling the external devices 315 from a data connection (e.g., communications port). Thus, a server storage system 305 may be moved freely, without the need to reconnect dedicated, wired communication media (e.g., Ethernet cables, optical cables). In contrast, the system 300 allows the server storage systems 305 to be moved anywhere where premises wiring is accessible, such as various electrical socket outlets.

In some embodiments, the PDU 310 might include at least two power inputs. Each power input might be coupled to a different circuit of the system 300. In a non-limiting example, a first power input of the PDU 310 may be coupled to circuit 320a while a second power input of the PDU 310 may be coupled to circuit 320b. Each circuit 320a and 320b may be associated with a different network (e.g., different local area networks, different service provider networks, a local area network and a service provider network, etc.). Thus, data transmitted over the at least two power input(s) 110 may be transmitted on different networks (e.g., different local area networks, different service provider networks, a local area network and a service provider network, etc.).

External devices 315 communicatively coupled to PDU 310 may select a network to transmit data and transmit data to the circuit (e.g., circuit 320a or circuit 320b) corresponding to the selected network via the power input corresponding to the selected network.

Figure 4:
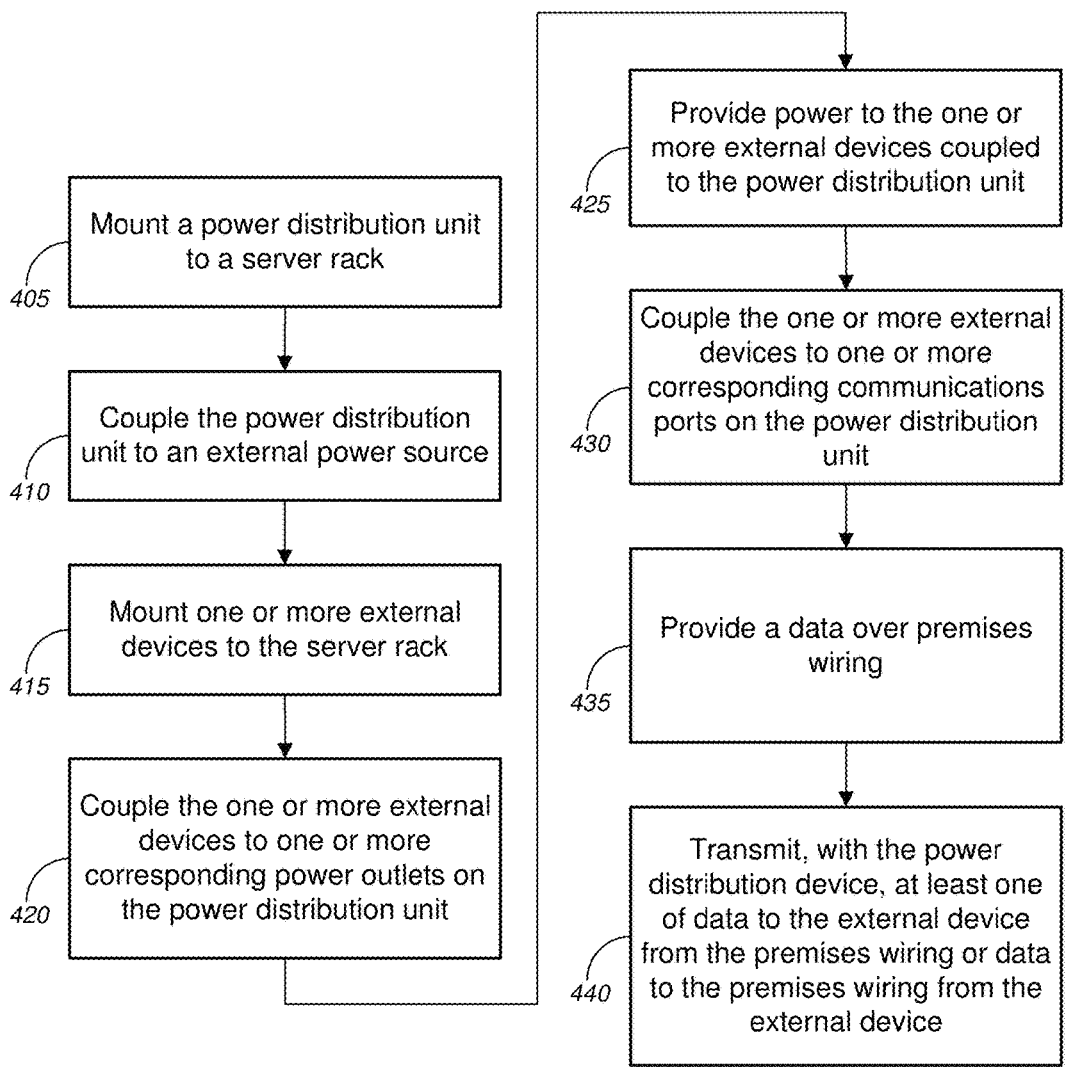
FIG. 4 is a flow diagram illustrating a method for implementing a power distribution unit, in accordance with various embodiments.

FIG. 4 is a flow diagram illustrating a method 400 for implementing a power distribution unit, in accordance with various embodiments.

While the techniques and procedures are depicted and/or described in a certain order for purposes of illustration, it should be appreciated that certain procedures may be reordered and/or omitted within the scope of various embodiments. Moreover, while the method 400 illustrated by FIG. 4 can be implemented by or with (and, in some cases, are described below with respect to) the systems, apparatuses, or embodiments 100, 200, and 300 of FIGS. 1, 2, and 3, respectively (or components thereof), such methods may also be implemented using any suitable hardware (or software) implementation. Similarly, while each of the systems, apparatuses, or embodiments 100, 200, and 300 of FIGS. 1, 2, and 3, respectively (or components thereof), can operate according to the method 400 illustrated by FIG. 4 (e.g., by executing instructions embodied on a computer readable medium), the systems, apparatuses, or embodiments 100, 200, and 300 of FIGS. 1, 2, and 3, respectively, can each also operate according to other modes of operation and/or perform other suitable procedures.

The method 400 may begin, at block 405, by mounting a power distribution unit ("PDU") to a server rack (block 405). In some embodiments, the PDU (described with respect to FIGS. 1-3) may be configured to provide both a power connection and a data connection (e.g., a PLC link) between an external power source and one or more external devices.

At block 410, the method 400 continues with coupling the PDU to an external power source. The PDU may electrically couple (via a wired connection) and/or communicatively couple (via a wired and/or wireless connection) one or more external devices to an external power source (e.g., A/C power source and/or D/C power source). The PDU may have at least two power inputs to receive power and data from and transmit data to at least two external power sources.

The method 400, at block 415, may further include mounting one or more external devices to the server rack. The one or more external devices may include, without limitation, one or more blade servers, one or more rack servers, one or more server computers (or stand-alone servers), one or more cooling systems, one or more data storage devices, one or more data storage drives, and/or one or more network devices.

Method 400 may continue, at block 420, by coupling the one or more external devices to one or more corresponding power outlets on the power distribution unit. Next, method 400, at block 425, may provide power to the one or more external devices coupled to the power distribution unit.

At block 430, method 400 may further include coupling the one or more external devices to one or more corresponding communications ports on the power distribution unit. Next, method 400, at block 435 may provide a data over powerline connection, with the power distribution unit, between the external device and a powerline. At block 440, the method 400, may transmit, with the power distribution device, at least one of data to the external device from the powerline or data to the powerline from the external device.

Exemplary System and Hardware Implementation

Figure 5:
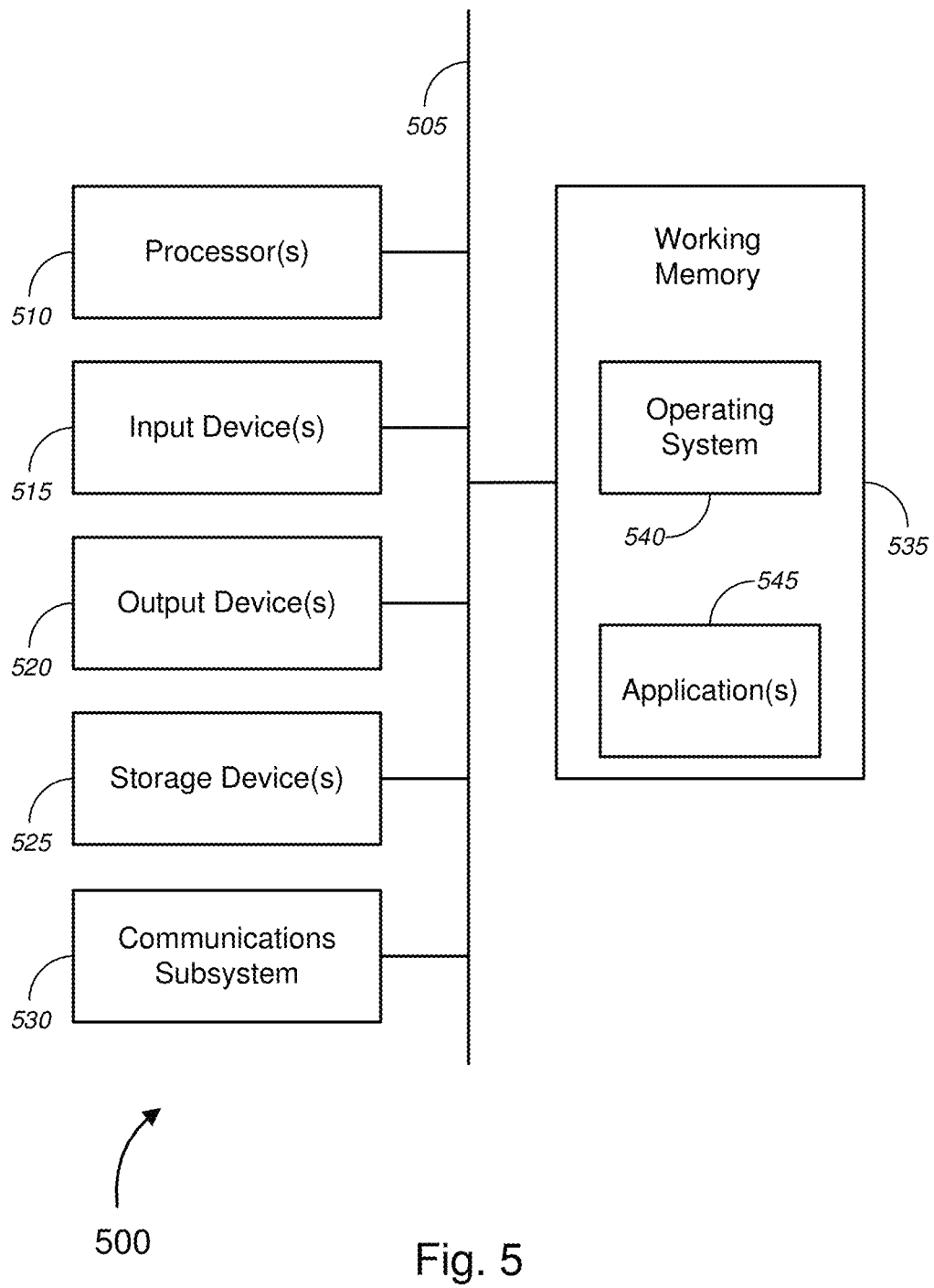
FIG. 5 is a block diagram illustrating an exemplary computer or system hardware architecture, in accordance with various embodiments.

FIG. 5 is a block diagram illustrating an exemplary computer or system hardware architecture, in accordance with various embodiments. FIG. 5 provides a schematic illustration of one embodiment of a computer system 500 of the hardware that can perform the methods provided by various other embodiments, as described herein, and/or can perform the functions of computer or hardware system (i.e., PDU 100, PDU 200, adapter(s) 210, external device(s) 225, external devices 315, PDU(s) 310, etc.), as described above. It should be noted that FIG. 5 is meant only to provide a generalized illustration of various components, of which one or more (or none) of each may be utilized as appropriate. FIG. 5, therefore, broadly illustrates how individual system elements may be implemented in a relatively separated or relatively more integrated manner.

The computer or hardware system 500—which might represent an embodiment of the computer or hardware system (i.e., PDU 100, PDU 200, adapter(s) 210, external device(s) 225, external devices 315, PDU(s) 310, etc.), described above with respect to FIGS. 1-4—is shown comprising hardware elements that can be electrically coupled via a bus 505 (or may otherwise be in communication, as appropriate). The hardware elements may include one or more processors 510, including, without limitation, one or more general-purpose processors and/or one or more special-purpose processors (such as microprocessors, digital signal processing chips, graphics acceleration processors, and/or the like); one or more input devices 515, which can include, without limitation, a mouse, a keyboard and/or the like; and one or more output devices 520, which can include, without limitation, a display device, a printer, and/or the like.

The computer or hardware system 500 may further include (and/or be in communication with) one or more storage devices 525, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including, without limitation, various file systems, database structures, and/or the like.

The computer or hardware system 500 might also include a communications subsystem 530, which can include, without limitation, a modem, a network card (wireless or wired), an infra-red communication device, a wireless communication device and/or chipset (such as a Bluetooth™ device, an 802.11 device, a WiFi device, a WiMax device, a WWAN device, cellular communication facilities, etc.), and/or the like. In some aspects, the communications subsystem 530 might also comprise a wireless video link system, which might utilize a wireless video link protocol comprising at least one of WirelessHD protocol, Wireless Home Digital Interface ("WHDI") protocol, or Wireless Gigabit Alliance ("WiGig") protocol, and/or the like. The communications subsystem 530 may permit data to be exchanged with a network (such as the network described below, to name one example), with other computer or hardware systems, and/or with any other devices described herein. In many embodiments, the computer or hardware system 500 will further comprise a working memory 535, which can include a RAM or ROM device, as described above.

The computer or hardware system 500 also may comprise software elements, shown as being currently located within the working memory 535, including an operating system 540, device drivers, executable libraries, and/or other code, such as one or more application programs 545, which may comprise computer programs provided by various embodiments (including, without limitation, hypervisors, VMs, and the like), and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 525 described above. In some cases, the storage medium might be incorporated within a computer system, such as the system 500. In other embodiments, the storage medium might be separate from a computer system (i.e., a removable medium, such as a compact disc, etc.), and/or provided in an installation package, such that the storage medium can be used to program, configure and/or adapt a general purpose computer with the instructions/code stored thereon. These instructions might take the form of executable code, which is executable by the computer or hardware system 500 and/or might take the form of source and/or installable code, which, upon compilation and/or installation on the computer or hardware system 500 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware (such as programmable logic controllers, field-programmable gate arrays, application-specific integrated circuits, and/or the like) might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer or hardware system (such as the computer or hardware system 500) to perform methods in accordance with various embodiments of the invention. According to a set of embodiments, some or all of the procedures of such methods are performed by the computer or hardware system 500 in response to processor 510 executing one or more sequences of one or more instructions (which might be incorporated into the operating system 540 and/or other code, such as an application program 545) contained in the working memory 535. Such instructions may be read into the working memory 535 from another computer readable medium, such as one or more of the storage device(s) 525. Merely by way of example, execution of the sequences of instructions contained in the working memory 535 might cause the processor(s) 510 to perform one or more procedures of the methods described herein.

The terms "machine readable medium" and "computer readable medium," as used herein, refer to any medium that participates in providing data that causes a machine to operate in a specific fashion. In an embodiment implemented using the computer or hardware system 500, various computer readable media might be involved in providing instructions/code to processor(s) 510 for execution and/or might be used to store and/or carry such instructions/code (e.g., as signals). In many implementations, a computer readable medium is a non-transitory, physical, and/or tangible storage medium. In some embodiments, a computer readable medium may take many forms, including, but not limited to, non-volatile media, volatile media, or the like. Non-volatile media includes, for example, optical and/or magnetic disks, such as the storage device(s) 525. Volatile media includes, without limitation, dynamic memory, such as the working memory 535. In some alternative embodiments, a computer readable medium may take the form of transmission media, which includes, without limitation, coaxial cables, copper wire and fiber optics, including the wires that comprise the bus 505, as well as the various components of the communication subsystem 530 (and/or the media by which the communications subsystem 530 provides communication with other devices). In an alternative set of embodiments, transmission media can also take the form of waves (including without limitation radio, acoustic and/or light waves, such as those generated during radio-wave and infra-red data communications).

Common forms of physical and/or tangible computer readable media include, for example, a floppy disk, a flexible disk, a hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read instructions and/or code.

Various forms of computer readable media may be involved in carrying one or more sequences of one or more instructions to the processor(s) 510 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer or hardware system 500. These signals, which might be in the form of electromagnetic signals, acoustic signals, optical signals, and/or the like, are all examples of carrier waves on which instructions can be encoded, in accordance with various embodiments of the invention.

The communications subsystem 530 (and/or components thereof) generally will receive the signals, and the bus 505 then might carry the signals (and/or the data, instructions, etc. carried by the signals) to the working memory 535, from which the processor(s) 505 retrieves and executes the instructions. The instructions received by the working memory 535 may optionally be stored on a storage device 525 either before or after execution by the processor(s) 510.

Figure 6:
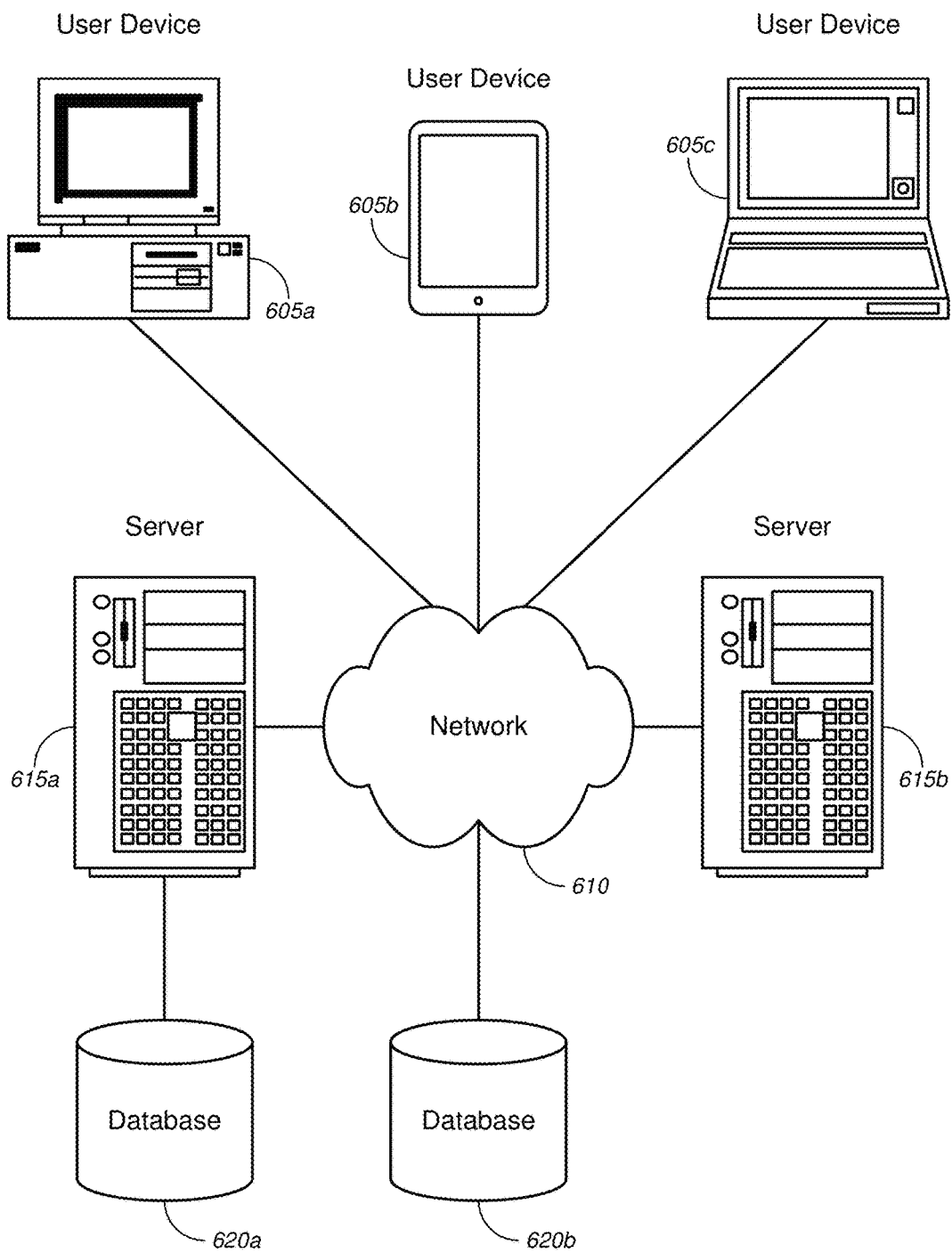
FIG. 6 is a block diagram illustrating a networked system of computers, computing systems, or system hardware architecture, which can be used in accordance with various embodiments.

As noted above, a set of embodiments comprises methods and systems for implementing a power distribution unit for transmitting data over a powerline. FIG. 6 illustrates a schematic diagram of a system 600 that can be used in accordance with one set of embodiments. The system 600 can include one or more user computers, user devices, or customer devices 605. A user computer, user device, or customer device 605 can be a general purpose personal computer (including, merely by way of example, desktop computers, tablet computers, laptop computers, handheld computers, and the like, running any appropriate operating system, several of which are available from vendors such as Apple, Microsoft Corp., and the like), cloud computing devices, a server(s), and/or a workstation computer(s) running any of a variety of commercially-available UNIX™ or UNIX-like operating systems. A user computer, user device, or customer device 605 can also have any of a variety of applications, including one or more applications configured to perform methods provided by various embodiments (as described above, for example), as well as one or more office applications, database client and/or server applications, and/or web browser applications. Alternatively, a user computer, user device, or customer device 605 can be any other electronic device, such as a thin-client computer, Internet-enabled mobile telephone, and/or personal digital assistant, capable of communicating via a network (e.g., the network(s) 610 described below) and/or of displaying and navigating web pages or other types of electronic documents. Although the exemplary system 600 is shown with two user computers, user devices, or customer devices 605, any number of user computers, user devices, or customer devices can be supported.

Certain embodiments operate in a networked environment, which can include a network(s) 610. Network(s) 610 may be one network or two or more different networks associated with different circuits of a data center (e.g., premises wiring). The network(s) 610 can be any type of network familiar to those skilled in the art that can support data communications using any of a variety of commercially-available (and/or free or proprietary) protocols, including, without limitation, TCP/IP, SNA™, IPX™, AppleTalk™, and the like. Merely by way of example, the network(s) 610 can each include a local area network ("LAN"), including, without limitation, a fiber network, an Ethernet network, a Token-Ring™ network and/or the like; a wide-area network ("WAN"); a wireless wide area network ("WWAN"); a virtual network, such as a virtual private network ("VPN"); the Internet; an intranet; an extranet; a public switched telephone network ("PSTN"); an infra-red network; a wireless network, including, without limitation, a network operating under any of the IEEE 802.11 suite of protocols, the Bluetooth™ protocol known in the art, and/or any other wireless protocol; and/or any combination of these and/or other networks. In a particular embodiment, the network might include an access network of the service provider (e.g., an Internet service provider ("ISP")). In another embodiment, the network might include a core network of the service provider, and/or the Internet.

Embodiments can also include one or more server computers 615 (which may correspond to external devices 225 and/or external devices 305 described with in FIG. 2 and FIG. 3, respectively). Each of the one or more server computers 615 may be coupled to a server rack. Each of the server computers 615 may be configured with an operating system, including, without limitation, any of those discussed above, as well as any commercially (or freely) available server operating systems. Each of the servers 615 may also be running one or more applications, which can be configured to provide services to one or more clients 605 and/or other servers 615. Each of the server computers 615 may be communicatively coupled to the one or more network(s) 610 via a power distribution unit (which may correspond to PDU 100, PDU 200, and/or PDU 310 described in FIG. 1, FIG. 2, FIG. 3, respectively). The PDU may be configured to provide both a power connection and a data connection (e.g., a PLC link) to the server computers 615.

Merely by way of example, one of the servers 615 might be a data server, a web server, a cloud computing device(s), or the like, as described above. The data server might include (or be in communication with) a web server, which can be used, merely by way of example, to process requests for web pages or other electronic documents from user computers 605. The web server can also run a variety of server applications, including HTTP servers, FTP servers, CGI servers, database servers, Java servers, and the like. In some embodiments of the invention, the web server may be configured to serve web pages that can be operated within a web browser on one or more of the user computers 605 to perform methods of the invention.

The server computers 615, in some embodiments, might include one or more application servers, which can be configured with one or more applications accessible by a client running on one or more of the client computers 605 and/or other servers 615. Merely by way of example, the server(s) 615 can be one or more general purpose computers capable of executing programs or scripts in response to the user computers 605 and/or other servers 615, including, without limitation, web applications (which might, in some cases, be configured to perform methods provided by various embodiments). Merely by way of example, a web application can be implemented as one or more scripts or programs written in any suitable programming language, such as Java™, C, C#™ or C++, and/or any scripting language, such as Perl, Python, or TCL, as well as combinations of any programming and/or scripting languages. The application server(s) can also include database servers, including, without limitation, those commercially available from Oracle™, Microsoft™, Sybase™, IBM™, and the like, which can process requests from clients (including, depending on the configuration, dedicated database clients, API clients, web browsers, etc.) running on a user computer, user device, or customer device 605 and/or another server 615. Data provided by an application server may be formatted as one or more web pages (comprising HTML, JavaScript, etc., for example) and/or may be forwarded to a user computer 605 via a web server (as described above, for example). Similarly, a web server might receive web page requests and/or input data from a user computer 605 and/or forward the web page requests and/or input data to an application server. In some cases, a web server may be integrated with an application server.

In accordance with further embodiments, one or more servers 615 can function as a file server and/or can include one or more of the files (e.g., application code, data files, etc.) necessary to implement various disclosed methods, incorporated by an application running on a user computer 605 and/or another server 615. Alternatively, as those skilled in the art will appreciate, a file server can include all necessary files, allowing such an application to be invoked remotely by a user computer, user device, or customer device 605 and/or server 615.

It should be noted that the functions described with respect to various servers herein (e.g., application server, database server, web server, file server, etc.) can be performed by a single server and/or a plurality of specialized servers, depending on implementation-specific needs and parameters.

In certain embodiments, the system can include one or more databases 620a-620n (collectively, "databases 620"). The location of each of the databases 620 is discretionary: merely by way of example, a database 620a might reside on a storage medium local to (and/or resident in) a server 615a (and/or a user computer, user device, or customer device 605). Alternatively, a database 620n can be remote from any or all of the computers 605, 615, so long as it can be in communication (e.g., via the network 610) with one or more of these. In a particular set of embodiments, a database 620 can reside in a storage-area network ("SAN") familiar to those skilled in the art. (Likewise, any necessary files for performing the functions attributed to the computers 605, 615 can be stored locally on the respective computer and/or remotely, as appropriate.) In one set of embodiments, the database 620 can be a relational database, such as an Oracle database, that is adapted to store, update, and retrieve data in response to SQL-formatted commands. The database might be controlled and/or maintained by a database server, as described above, for example. Each database 620 may be communicatively coupled to the one or more network(s) 610 via a power distribution unit (which may correspond to PDU 100, PDU 200, and/or PDU 310 described in FIG. 1, FIG. 2, FIG. 3, respectively). The PDU may be configured to provide both a power connection and a data connection (e.g., a PLC link) to the databases 620.

These and other functions of the system 600 (and its components) are described in greater detail above with respect to FIGS. 1-4.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. An apparatus comprising:
   at least one power input configured to receive power from at least one external power source;
   a plurality of power outputs, each power output configured to receive power from the at least one external power source and configured to deliver power to an external device coupled to each power output;
   a plurality of communications ports, each communications port configured to deliver data to and receive data from the external device, via the at least one power input; and
   at least one adapter, each adapter configured to transmit data received from at least two communications ports from among the plurality of communications ports to one power input of the at least one power input and transmit data received from one power input of the at least one power input to at least two communications ports from among the plurality of communications ports.

2. The apparatus of claim 1, wherein the at least one adapter is configured according to a G.Hn specification for power line communications.

3. The apparatus of claim 1, wherein the apparatus is configured to be coupled to a server rack.

4. The apparatus of claim 3, wherein the external device is a server on the server rack.

5. The apparatus of claim 1, wherein the external device is communicatively coupled to a corresponding communications port via a wired connection.

6. The apparatus of claim 1, wherein each communications port on the apparatus is a different collision domain.

7. The apparatus of claim 1, wherein at least one communications port of the plurality of communications ports is an Ethernet port.

8. The apparatus of claim 1, wherein each adapter is configured to determine a particular communications port from among the at least two communications ports to receive a data stream received from the at least one power input.

9. The apparatus of claim 1, wherein the apparatus has at least two power inputs, wherein each power input is on a different circuit, and wherein each circuit is a different network.

10. The apparatus of claim 9, wherein the at least one adapter is configured to switch between the at least two power inputs, and wherein the at least one adapter is configured to determine a particular power input from among the at least two power inputs to receive a data stream from at least one communications port.

11. A system comprising:
    one or more server racks;
    one or more computing devices coupled to each of the one or more server racks;
    one or more power distribution units coupled to the one or more server racks,
       wherein at least one of the one or more power distribution units comprises:
          at least one power input configured to receive power from at least one external power source;
          a plurality of power outputs, each power output configured to receive power from the at least one external power source and configured to deliver power to a computing device coupled to each power output;
          a plurality of communications ports, each communications port configured to deliver data to and receive data from the computing device via the at least one power input; and
          at least one adapter, each adapter configured to transmit data received from at least two communications ports from among the plurality of communications ports to one power input of the at least one power input and transmit data received from one power input of the at least one power input to at least two communications ports from among the plurality of communications ports;
    wherein one or more server racks are coupled to a network, defined at least in part by a premises wiring to which the external power source is coupled, through the one or more power distribution units.

12. The system of claim 11, wherein the premises wiring includes one or more power circuits, wherein each power circuit is coupled to at least one power distribution unit, and wherein each power circuit is a different network.

13. The system of claim 11, wherein the one or more server racks are configured to be moved by disengaging the at least one external power source without disengaging one or more computing devices coupled to at least one of one or more corresponding communications port or one or more corresponding power outputs.

14. The apparatus of claim 11, wherein the at least one adapter is configured to manage channel access through time-division multiple access.

15. The system of claim 11, wherein each adapter is configured to determine a particular communications port from among the plurality of communications ports to receive a data stream received from the at least one power input.

16. The system of claim 11, wherein at least one of the one or more computing devices is configured to receive a data stream based on a determination, by the at least one computing device, that the data stream received from the power input is addressed to the at least one computing device.

17. A method, comprising:
coupling a power distribution unit of a server rack to an external power source via premises wiring, wherein the premises wiring provides power to the power distribution unit from the external power source;
mounting one or more external devices to the server rack;
coupling the one or more external devices to one or more corresponding power outlets of the power distribution unit;
providing power, with the power distribution unit, to the one or more external devices coupled to the one or more corresponding power outlets on the power distribution unit;
coupling the one or more external devices to one or more corresponding communications ports of the power distribution unit;
providing data, received over the premises wiring, to a respective communications port of the one or more communications ports of the power distribution unit; and
transmitting, with the power distribution unit, data received from the external device over the premises wiring;
wherein at least two communications ports of the one or more corresponding communications ports are configured to deliver data to and receive data from the premises wiring which provides power to the power distribution unit.

\* \* \* \* \*